(12) United States Patent
Huang et al.

(10) Patent No.: US 11,765,822 B1
(45) Date of Patent: Sep. 19, 2023

(54) PRINTED CIRCUIT BOARDS WITH MESHED CONDUCTIVE STRUCTURES

(71) Applicant: Marvell Asia Pte Ltd, Singapore (SG)

(72) Inventors: Shaowu Huang, Sunnyvale, CA (US); Dance Wu, Palo Alto, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 0 days.

(21) Appl. No.: 17/463,598

(22) Filed: Sep. 1, 2021

Related U.S. Application Data

(60) Provisional application No. 63/074,351, filed on Sep. 3, 2020.

(51) Int. Cl.
H05K 1/02 (2006.01)
H05K 3/46 (2006.01)
H05K 1/11 (2006.01)

(52) U.S. Cl.
CPC ......... *H05K 1/0298* (2013.01); *H05K 1/0225* (2013.01); *H05K 1/0287* (2013.01); *H05K 1/111* (2013.01); *H05K 3/4644* (2013.01); H05K 2201/09681 (2013.01)

(58) Field of Classification Search
CPC .... H05K 1/0298; H05K 1/111; H05K 3/4644; H05K 2201/09681; H05K 1/0287; H05K 1/0225
See application file for complete search history.

(56) References Cited

U.S. PATENT DOCUMENTS

| | | | | |
|---|---|---|---|---|
| 4,642,592 A | * | 2/1987 | Beeck | H05K 1/0215 245/8 |
| 5,300,899 A | * | 4/1994 | Suski | H05K 1/0253 174/254 |
| 5,479,138 A | * | 12/1995 | Kuroda | H05K 1/0253 333/1 |
| 5,818,315 A | * | 10/1998 | Moongilan | H01P 3/08 174/117 FF |
| 6,331,678 B1 | * | 12/2001 | Wang | H05K 1/0271 428/209 |
| 6,559,377 B1 | * | 5/2003 | Noda | H05K 1/0253 174/254 |
| 9,253,880 B2 | * | 2/2016 | Park | H05K 3/4038 |
| 10,288,825 B2 | * | 5/2019 | Zhao | H05K 1/189 |
| 2001/0010270 A1 | * | 8/2001 | Lin | H05K 9/0039 174/268 |
| 2004/0188135 A1 | * | 9/2004 | Brodsky | H05K 1/0224 29/846 |
| 2013/0075144 A1 | * | 3/2013 | Park | H01L 23/49811 29/846 |
| 2013/0313013 A1 | * | 11/2013 | Porta | H05K 1/0225 174/268 |

(Continued)

*Primary Examiner* — Steven T Sawyer

(57) ABSTRACT

Electronic apparatus includes a dielectric substrate and alternating layers of conducting and dielectric materials disposed over the dielectric substrate, including at least first and second patterned layers of the conducting material separated by an intervening layer of the dielectric material. A conductive trace is disposed within the first patterned layer of the conducting material. A conductive mesh extends within the second patterned layer of the conducting material over a region that overlaps transversely with at least a part of the conductive trace in the first patterned layer.

17 Claims, 5 Drawing Sheets

(56) References Cited

U.S. PATENT DOCUMENTS

| | | | |
|---|---|---|---|
| 2014/0231121 A1* | 8/2014 | Pai | H05K 1/0224 174/254 |
| 2015/0340751 A1* | 11/2015 | Watanabe | H01P 3/08 333/1 |
| 2015/0342030 A1* | 11/2015 | Watanabe | H05K 1/0225 174/268 |
| 2016/0020500 A1* | 1/2016 | Matsuda | H01P 3/085 333/238 |

\* cited by examiner

PRINTED CIRCUIT BOARDS WITH MESHED CONDUCTIVE STRUCTURES

CROSS-REFERENCE TO RELATED APPLICATION

This application claims the benefit of U.S. Provisional Patent Application 63/074,351, filed Sep. 3, 2020, which is incorporated herein by reference.

FIELD OF THE INVENTION

The present invention relates generally to electronic devices, and particularly to printed circuits and methods for their design and manufacture.

BACKGROUND

Printed circuit boards (PCBs) are widely used in a broad range of applications. A typical PCB comprises a dielectric substrate with alternating layers of conducting and dielectric materials disposed over the substrate. The substrate may comprise any suitable dielectric material, such as a polymer, glass, ceramic, or a dielectric-coated metal. The conducting layers are patterned, typically by photolithographic or additive manufacturing processes, to define circuit structures, such as traces, as well as pads for mounting integrated circuit (IC) chips and discrete electronic components on the PCB.

Many printed circuits contain transmission lines for high-frequency signals. The transmission line typically comprises a wire trace and one or more reference planes. Such a transmission line has a characteristic impedance, which is determined by the geometry of the trace, including its width, thickness and distance from the reference plane, as well as by the dielectric constant of the intervening dielectric layer. When the transmission line terminates at a pad, on which an IC or other component is to be mounted, it is important that the impedance of the termination match the transmission line impedance in order to reduce the reflection and minimize the loss of signal. One solution that is commonly used for this purpose is to create a void in one of the conducting layers. For example, a void may be created by etching away the conducting material in a certain area of an internal conductive layer of the PCB, such as in a solid conductive area that is to serve as a reference plane. A dielectric layer is then deposited over the internal conductive layer, and a pad is formed in the outer conductive layer over the area of the void.

SUMMARY

Embodiments of the present invention that are described hereinbelow provide PCBs with improved electrical and electromagnetic properties, as well as methods for design and manufacture of such PCBs.

There is therefore provided, in accordance with an embodiment of the invention, electronic apparatus, including a dielectric substrate and alternating layers of conducting and dielectric materials disposed over the dielectric substrate, including at least first and second patterned layers of the conducting material separated by an intervening layer of the dielectric material. A conductive trace is disposed within the first patterned layer of the conducting material. A conductive mesh extends within the second patterned layer of the conducting material over a region that overlaps transversely with at least a part of the conductive trace in the first patterned layer.

In some embodiments, the conductive trace includes at least one pad, and the region of the conductive mesh extends transversely across an area defined by the at least one pad. In one embodiment, the at least one pad includes a plurality of mutually-adjacent pads configured for mounting an electronic component thereon, and the region of the conductive mesh extends transversely across the area of the plurality of the mutually-adjacent pads. Additionally or alternatively, the first and second patterned layers of the conducting material are patterned to define a transmission line having a characteristic impedance, which terminates at the at least one pad, and the conductive mesh is patterned and sized so as to match the characteristic impedance.

In some embodiments, the conductive mesh is one of a plurality of conductive meshes extending over different regions of the second patterned layer, including at least first and second conductive meshes having different, respective geometrical characteristics. The different, respective geometrical characteristics may be selected from a group of properties consisting of a mesh pattern, a mesh pitch, a mesh trace width, and a mesh angle.

Additionally or alternatively, the conductive mesh defines a pattern selected from a group of patterns consisting of a rectilinear pattern, a triangular pattern, a hexagonal pattern, and an irregular pattern.

In a disclosed embodiment, the alternating layers further include a third patterned layer of the conducting material, including a further conductive mesh in the third patterned layer.

There is also provided, in accordance with an embodiment of the invention, a method for producing an electrical circuit. The method includes depositing alternating layers of conducting and dielectric materials on a substrate, including at least first and second layers of the conducting material separated by at least a third layer of the dielectric material. The first layer of the conducting material is patterned so as to form a conductive trace. The second layer of the conducting material is patterned so as to form a conductive mesh extending over a region that overlaps transversely with at least a part of the conductive trace in the first layer.

The present invention will be more fully understood from the following detailed description of the embodiments thereof, taken together with the drawings in which:

DETAILED DESCRIPTION OF EMBODIMENTS

Although voids in a printed circuit layer can improve impedance matching, they create problems of electromagnetic compatibility (EMC) of the PCB. For example, voids can behave like aperture antennas, giving rise to radiated emissions that interfere with other circuit components. Furthermore, voids disrupt the signal return on differential signal traces and can thus amplify common mode conversion. In systems with strict EMC requirements, such as automotive Ethernet systems, for example, voids may give rise to unacceptable levels of interference and mode conversion. Consequently, it is difficult in many situations to achieve optimal impedance matching while still satisfying EMC requirements.

Embodiments of the present invention that are described herein address these problems by using conductive meshes in place of voids. In these embodiments, a conductive mesh extends within a patterned layer of the conducting material over a region that overlaps transversely with at least a part of a conductive trace in another patterned layer. For example, when the conductive trace comprises a pad, the region of the conductive mesh may extend transversely across an area defined by the pad. When the layers of the conducting material are patterned to define a transmission line having a characteristic impedance, the conductive mesh may be patterned and sized so as to match this characteristic impedance The term "mesh" is used in the context of the present description and in the claims to refer to a web or net made up of interconnected conductive traces, with open spaces filled with dielectric material between the traces. A mesh in this context contains at least four distinct open spaces between the conductive traces, and more typically will contain at least ten such spaces or even twenty spaces or more between the conductive traces of the mesh. The mesh pattern, mesh pitch, mesh trace width, and mesh angle can all be adjusted in order to achieve the desired electrical properties, and specifically to provide good impedance matching with low common mode conversion and low levels of electromagnetic emission. A wide variety of mesh patterns can be used and optimized for these purposes, including, for example, rectilinear patterns, triangular patterns, hexagonal patterns, and irregular patterns.

Figure 1:
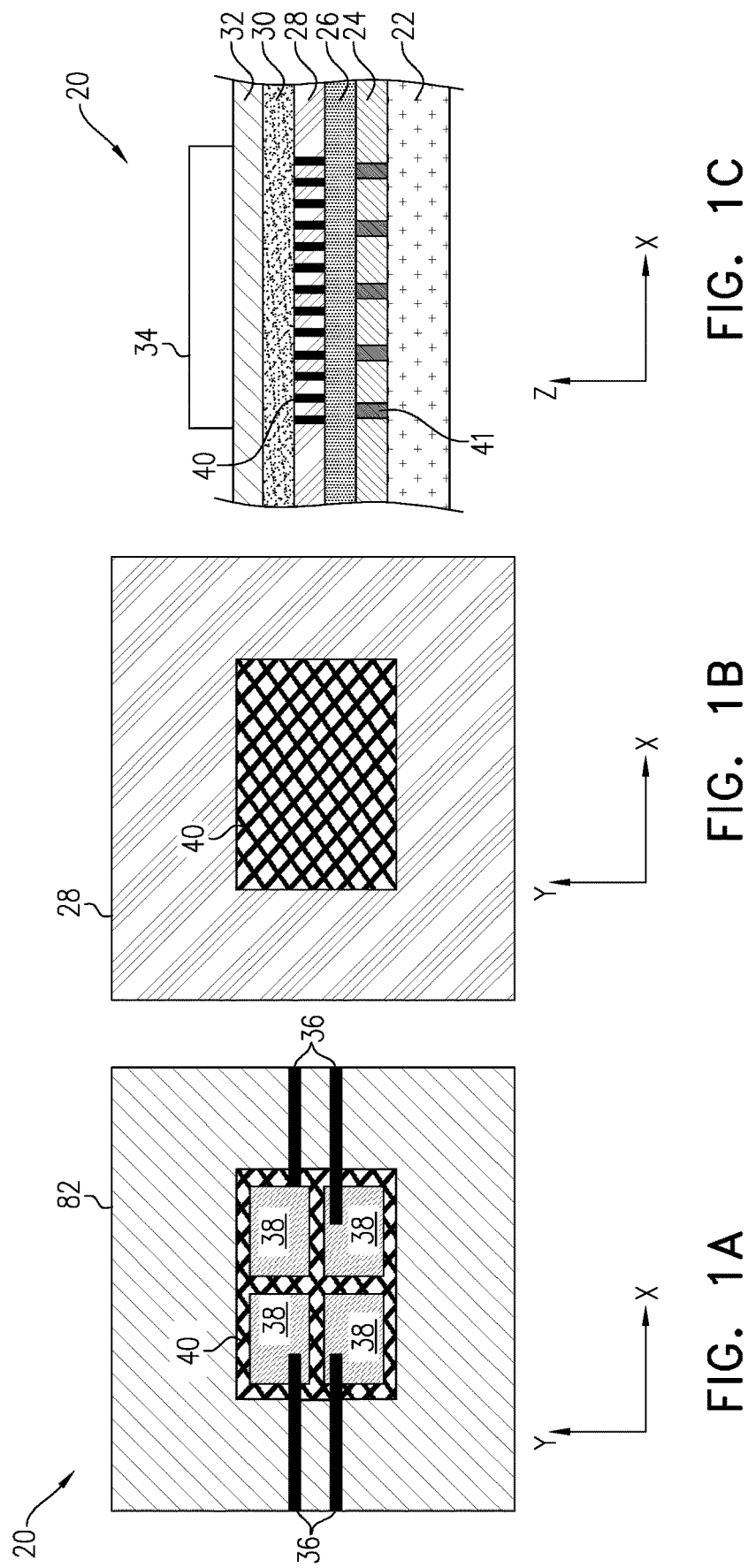
FIG. 1A is schematic top view of a PCB including a conductive mesh, in accordance with an embodiment of the invention.
FIG. 1B is a schematic top view of an internal conductive layer within the PCB of FIG. 1A.
FIG. 1C is a schematic sectional view of the PCB of FIG. 1A.

Reference is now made to FIGS. 1A-1C, which schematically illustrate a PCB 20 including a conductive mesh 40, in accordance with an embodiment of the invention. FIG. 1A is schematic top view of PCB 20, while FIG. 1B is a schematic top view of an internal conductive layer 28 containing mesh 40 within PCB 20. FIG. 1C is a schematic sectional view of PCB 20, taken through the area shown in FIGS. 1A and 1B. In these and subsequent figures, the planar surface of PCB 20 and the layers deposited on the PCB are assumed to be oriented in the X-Y plane, and the term "transverse" refers to dimensions and distances in the X-Y plane.

PCB 20 comprises a dielectric substrate 22, on which alternating layers 24, 28, 32 of conducting material and layers 26, 30 of dielectric material have been deposited in sequence. In typical manufacturing processes, the conducting material in layers 24, 28, 32 comprises copper, which is patterned to define traces and other structures, while the dielectric material in layers 26, 30 comprises a suitable polymer, as is known in the art. The principles of the present invention, however, are not limited to such materials, and the principles of the present invention may similarly be applied using conducting and dielectric materials of other types. Although only small numbers of layers and conductive structures are shown in FIGS. 1A-C for the sake of simplicity, in practice the PCB may contain a larger number of layers, on one or both sides of substrate 22, with more complex patterning.

In the pictured embodiment, conductive traces 36, terminating at mutually-adjacent pads 38, are formed in the upper layer 32 of conductive material. As shown in FIG. 1C, an electronic component 34, such as an IC or a passive component, is mounted on pads 38. Conductive mesh 40 in layer 28 is separated from traces 36 and pads 38 by intervening layer 30 of the dielectric material. The dark lines in mesh 40 represent interconnected conductive traces, while the spaces between these dark lines are filled with a dielectric material, such as the material deposited over mesh 40 in layer 30. Conductive mesh 40 extends within layer 28 over a region that overlaps transversely with at least a part of conductive traces 36 and pads 38 in layer 32. Specifically, in the pictured embodiment, conductive mesh 40 extends transversely across the area of several mutually-adjacent pads 38. The pattern and size of conductive mesh 40 are chosen, for example, so that pads 38 match the characteristic impedance of the transmission lines defined by traces 36.

Although conductive mesh 40 is shown in FIGS. 1A-C only in layer 28, additional conductive meshes may be formed in one or more additional layers of PCB 20. For example, the conductive material in layer 24 may be patterned to include a conductive mesh 41, in addition to or instead of mesh 40 in layer 28.

Figure 2:
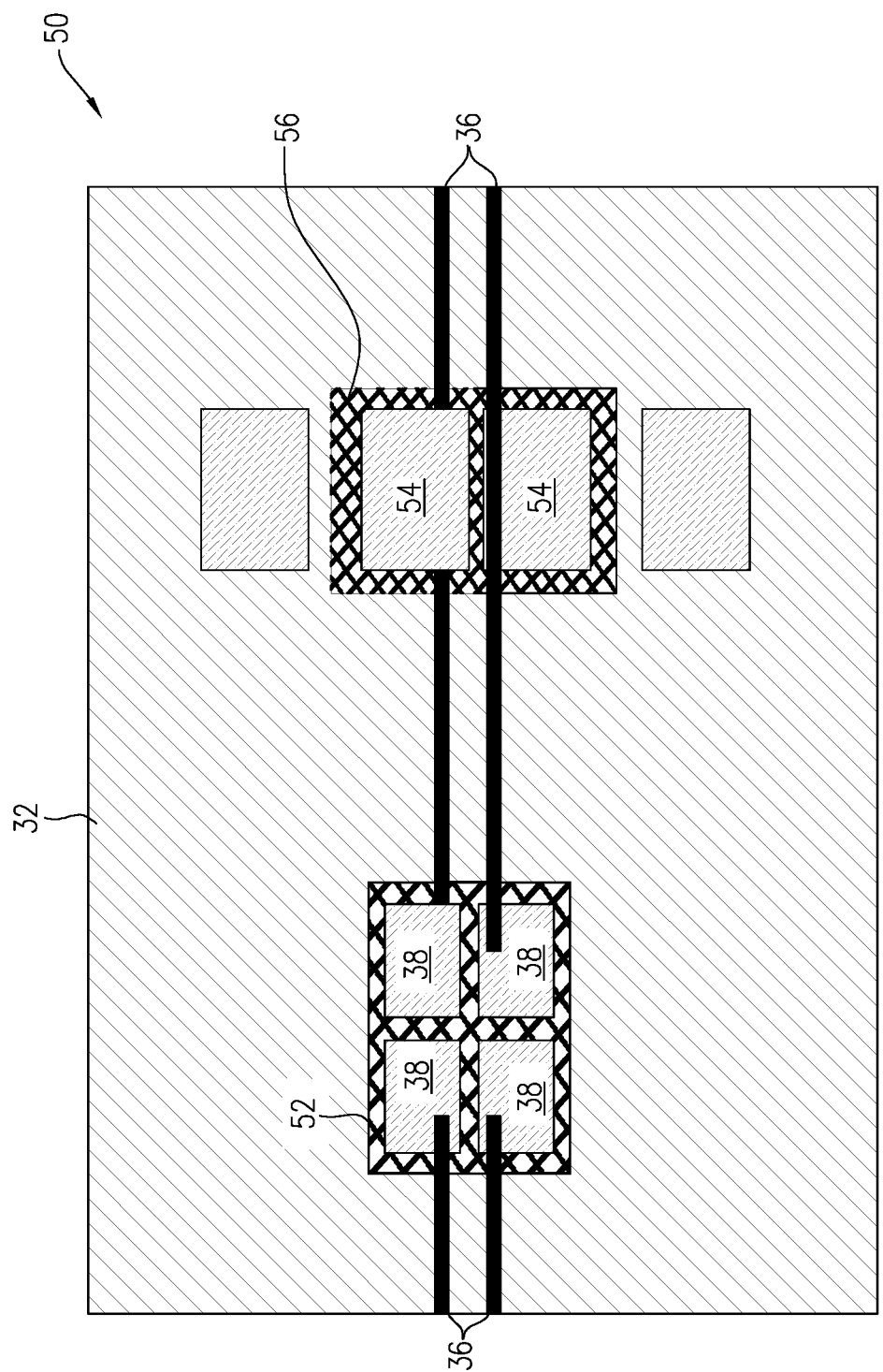
FIG. 2 is a schematic top view of a PCB including a conductive mesh, in accordance with another embodiment of the invention.
Figure 3C:
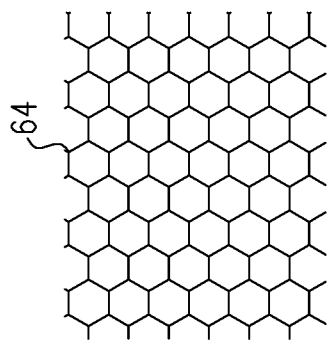
FIGS. 3A, 3B, 3C, 3D, 3E, 3F and 3G are schematic top views of conductive mesh patterns for use in a PCB, in accordance with embodiments of the invention.
Figure 3F:
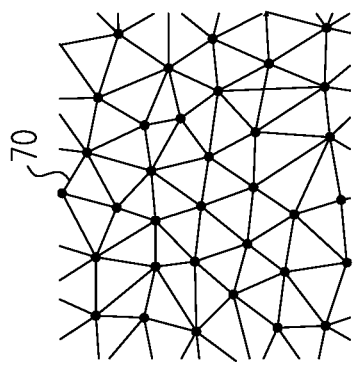
Figure 3B:
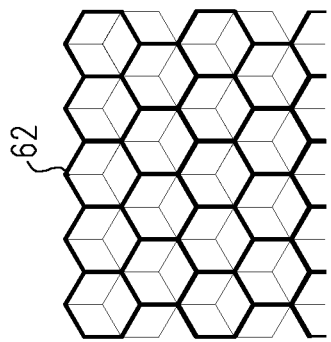
Figure 3E:
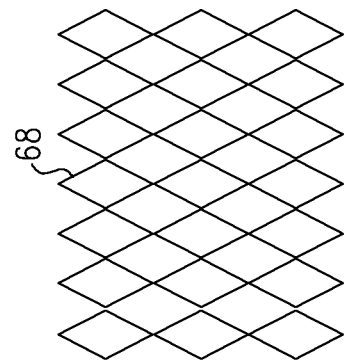
Figure 3A:
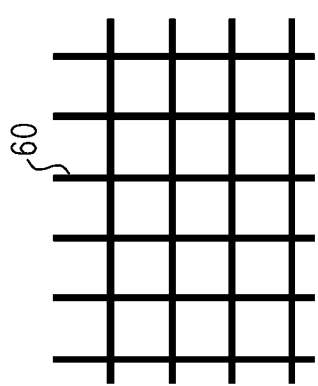
Figure 3D:
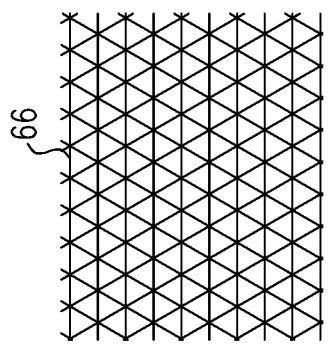
Figure 3G:
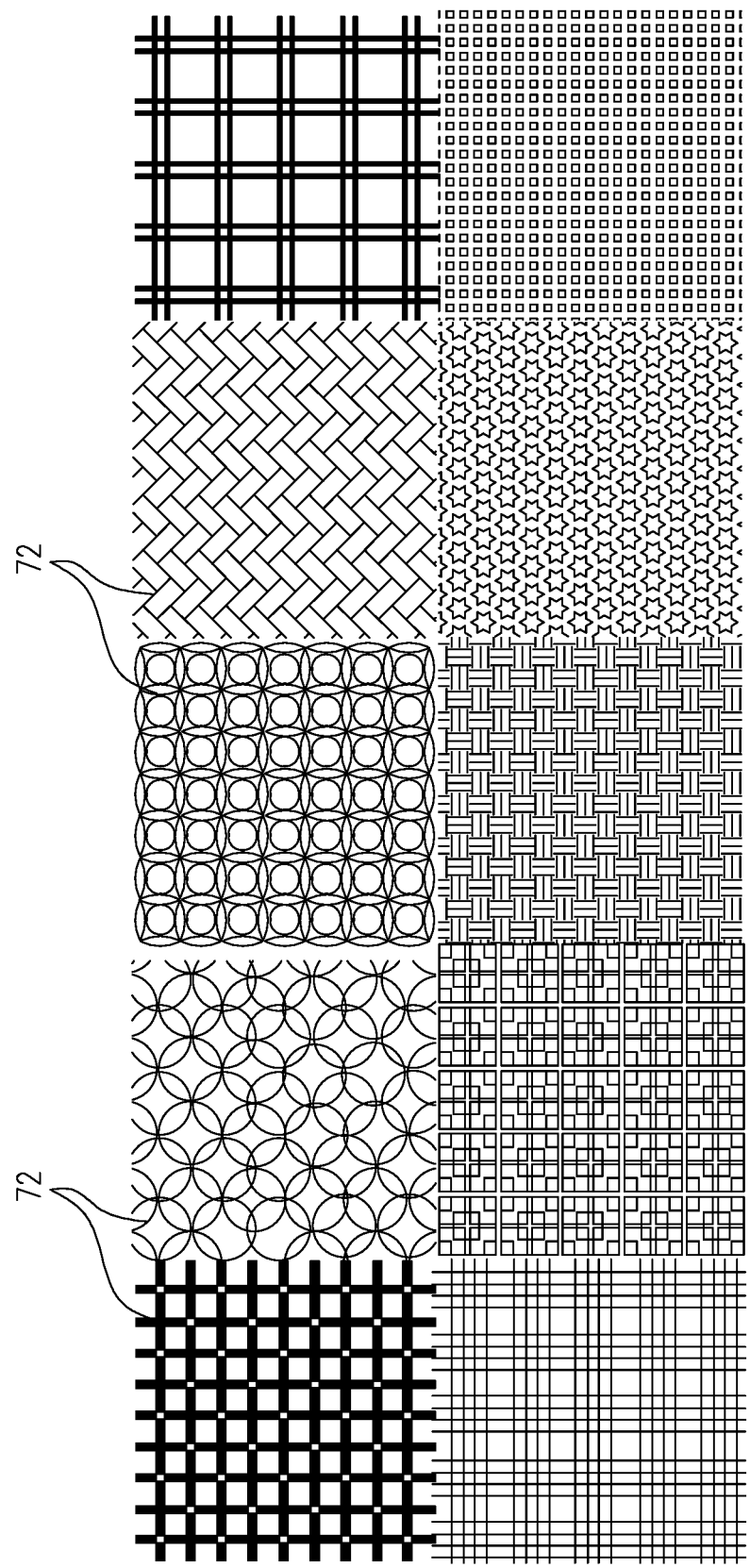

FIG. 2 is a schematic top view of a PCB 50, in accordance with another embodiment of the invention. In this example, layer 32 in PCB 50 contains multiple conductive meshes 52, 56, which extend over different regions within layer 32. Specifically mesh 52 overlaps with pads 38, while mesh 56 overlaps with pads 54. Meshes 52 and 56 have different, respective geometrical characteristics, which are chosen to provide the desired electrical and electromagnetic characteristics in conjunction with the pads that they overlap. In the pictured example, mesh 56 has a higher density (i.e., a smaller pitch) than mesh 52. Alternatively or additionally, the different meshes may differ in other characteristics, such as the mesh patterns, trace widths, and/or mesh angle relative to the traces that they overlap.

FIGS. 3A, 3B, 3C, 3D, 3E, 3F and 3G are schematic top views of conductive mesh patterns 60, 62, 64, 66, 68, 70 and 72 for use in a PCB, in accordance with embodiments of the invention. For example, pattern 60 is rectilinear, patterns 62 and 64 are hexagonal, pattern 66 is triangular, and pattern 68 is rhombic. Pattern 70 is irregular, for example pseudorandom, meaning that the pattern is aperiodic. Such irregular patterns are useful in avoiding resonances that could otherwise give rise to high-frequency emissions. The optimal pattern may be chosen for each mesh that is to be formed a PCB on the basis of considerations including minimizing signal losses and minimizing electromagnetic emissions.

Alternatively, substantially any suitable pattern may be used, such as patterns 72, in order to optimize the performance of the PCB.

Figure 4:
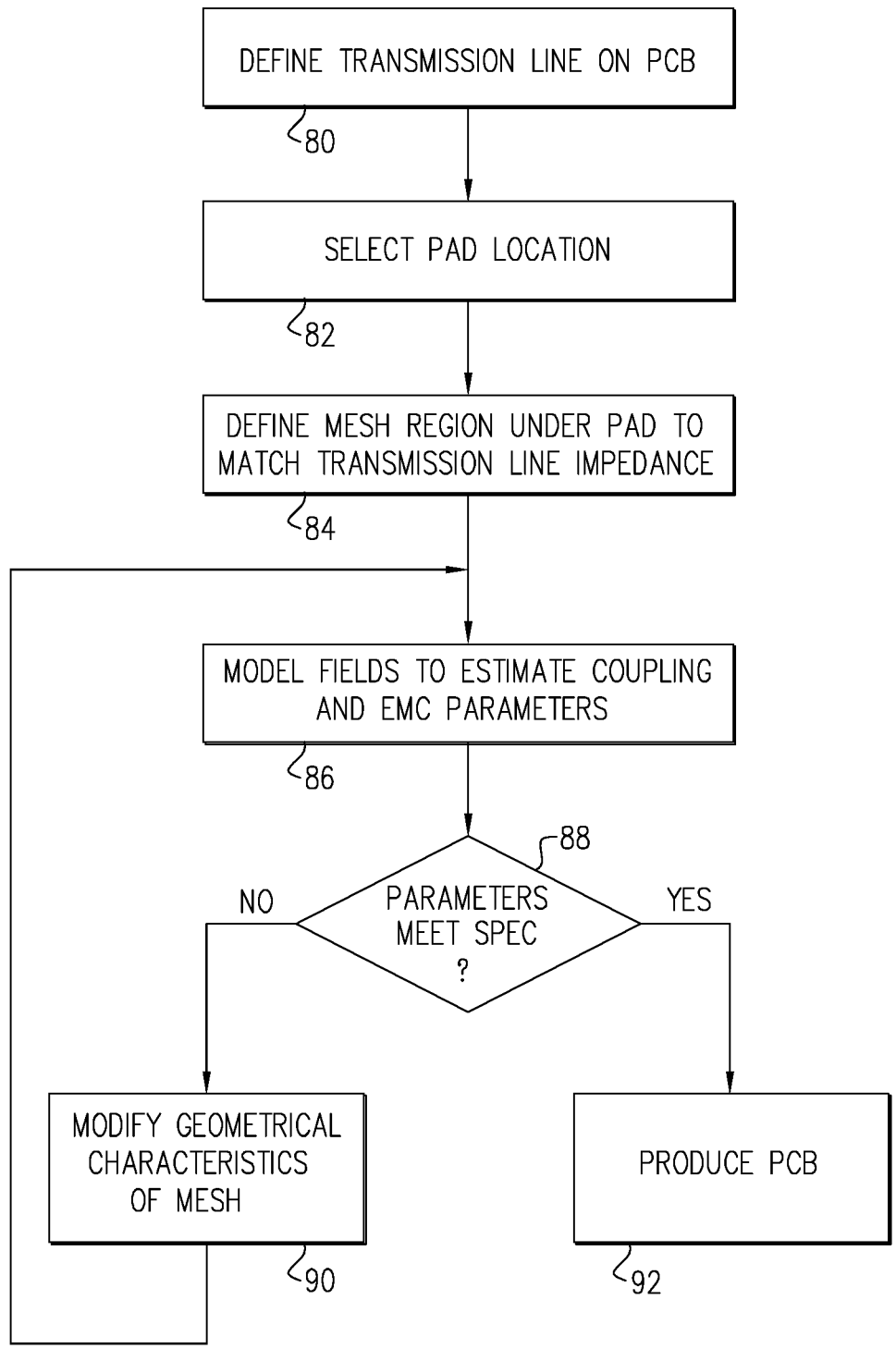
FIG. 4 is a flow chart that schematically illustrates a method for designing and producing a PCB including a conductive mesh, in accordance with an embodiment of the invention.

FIG. 4 is a flow chart that schematically illustrates a method for designing and producing a PCB including a mesh pattern, in accordance with an embodiment of the invention. The method is described, for the sake of convenience and clarity, with reference to the components of PCB 20, as shown in FIGS. 1A-C. Alternatively, this method may be applied, mutatis mutandis, in the design of substantially any multilayer PCB.

As part of the design process, a transmission line is defined for fabrication on the PCB, at a transmission line definition step 80. The transmission line is designed with a certain characteristic impedance, which is to be achieved by appropriate patterning of traces 36 and other pattern features in the conducting material of layers 32 and 28. The transmission line is designed to terminate at one or more pads 38, whose location is selected in a pad definition step 82.

A conductive mesh 40 is defined under pads 38, at a mesh region definition step 84. The geometric characteristics of mesh 40, such as the size and features of the mesh pattern, are chosen so as to match the characteristic impedance of the transmission line. As noted earlier, the mesh characteristics that can be chosen and adjusted for this purpose include the mesh pattern (for example, the patterns shown in FIGS. 3A-G); the pitch of the mesh pattern; the trace width of the interconnected conductive traces making up the mesh pattern; and the mesh angle, i.e., the angle of rotation of the mesh within the X-Y plane.

After the initial choice of the mesh characteristics, an electronic design automation (EDA) tool is used to model the electrical and magnetic fields in the vicinity of mesh 40, and thus to estimate the relevant coupling and EMC parameters of the PCB, at a modeling step 86. Various tools that are known in the art may be used for this purpose, for example the Ansys HFSS 3D High-Frequency Electromagnetic Simulation Software package offered by ANSYS, Inc. (Canonsburg, Pennsylvania). This model provides values of key parameters such as the signal loss at pads 38, which is indicative of the quality of impedance matching, as well as mode conversion (coupling of differential signals to common mode) and radiated emissions.

The designer compares these parameters to benchmark values defined by the product specification, at a parameter evaluation step 88. For example, in an automotive application, the designer may evaluate whether the parameters satisfy the EMC requirements specified for automotive Ethernet networks. If not, the model created at step 86 may suggest changes that can be made in the geometrical characteristics of mesh 40 in order to bring the parameters within the specified limits, at a mesh modification step 90. For example, the pitch or angle of the mesh pattern may be modified, as explained above.

Typically, after modifying the geometrical characteristics of the mesh at step 90, the modeling and parameter evaluation at steps 86 and 88 are repeated. This cycle of modification and evaluation can be iterated multiple times until an optimal mesh design is found. At that point, the designs of the patterns of layers 24, 28, 32 are finalized and fabricated, at a production step 92.

Although the embodiments that are described above are directed specifically to the use of a mesh in one conducting layer on a PCB in conjunction with an overlapping trace in another layer, in alternative embodiments (not shown in the figures), a conductive mesh may be used in a PCB layer independently of any overlapping trace. For example, a mesh may be used in an area of a ground plane or a power plane to avoid resonances and thus reduce electromagnetic emissions. In other embodiments, electromagnetic bandgap structures (not shown in the figures) may be used instead of a mesh in facilitating impedance matching and reducing emissions.

The embodiments described above are cited by way of example, and the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for producing an electrical circuit, the method comprising:
depositing alternating layers of conducting and dielectric materials on a substrate, including at least first and second layers of the conducting material separated by at least a third layer of the dielectric material;
patterning the first layer of the conducting material so as to form a conductive trace terminating in a pad; and
patterning the second layer of the conducting material so as to define a solid conductive area, to serve as a reference plane, extending within the second patterned layer of the conducting material over a first region that overlaps with the conductive trace in the first patterned layer, and to form a conductive mesh extending over a second region that overlaps transversely with an area of the pad in the first patterned layer.

2. The method according to claim 1, wherein patterning the first layer comprises forming a plurality of mutually-adjacent pads, which terminate respective conductive traces and are configured for mounting an electronic component thereon, and wherein patterning the second layer comprises extending the conductive mesh transversely across the area of the plurality of the mutually-adjacent pads.

3. The method according to claim 1, wherein patterning the first and second layers of the conducting material comprises defining a transmission line having a characteristic impedance, which terminates at the pad, and wherein patterning the second layer comprises patterning and sizing the conductive mesh so as to match the characteristic impedance.

4. The method according to claim 1, wherein patterning the second layer comprises forming a plurality of conductive meshes extending over different regions of the second patterned layer and comprising at least first and second conductive meshes having different, respective geometrical characteristics.

5. The method according to claim 1, wherein patterning the second layer comprises selecting geometrical characteristics of the conductive mesh from a group of properties consisting of a mesh pattern, a mesh pitch, a mesh trace width, and a mesh angle.

6. The method according to claim 1, wherein depositing the alternating layers comprises depositing and patterning a third layer of the conducting material, including a further conductive mesh in the third patterned layer.

7. The method according to claim 5, wherein patterning the second layer comprises optimizing geometrical characteristics of the mesh pattern so as to reduce electromagnetic emission in a specified frequency band to within a predefined limit by modeling electrical and magnetic fields in the area of the pad, and selecting the geometrical characteristics, based on the modeled electrical and magnetic fields, in order to bring the electromagnetic emission to within the predefined limit.

8. An electronic apparatus, comprising:
a dielectric substrate;
alternating layers of conducting and dielectric materials disposed over the dielectric substrate, including at least first and second patterned layers of the conducting material separated by an intervening layer of the dielectric material;

a conductive trace, terminating in a pad, disposed within the first patterned layer of the conducting material;

a solid conductive area, to serve as a reference plane, extending within the second patterned layer of the conducting material over a first region that overlaps with the conductive trace in the first patterned layer; and a conductive mesh extending within the second patterned layer of the conducting material over a second region that overlaps transversely with an area of the pad in the first patterned layer.

9. The electronic apparatus according to claim 8, wherein the conductive trace comprises a plurality of mutually-adjacent pads, which terminate respective conductive traces and are configured for mounting an electronic component thereon, and wherein the first region extends transversely across the area of the plurality of the mutually-adjacent pads.

10. The electronic apparatus according to claim 8, wherein the first and second patterned layers of the conducting material are patterned to define a transmission line having a characteristic impedance, which terminates at the pad, and wherein the conductive mesh is patterned and sized so as to match the characteristic impedance.

11. The electronic apparatus according to claim 8, wherein the alternating layers further comprise a third patterned layer of the conducting material, including a further conductive mesh in the third patterned layer.

12. The electronic apparatus according to claim 8, wherein the second region is contained within the first region.

13. The electronic apparatus according to claim 12, wherein the conductive mesh is one of a plurality of conductive meshes extending over different regions of the second patterned layer within the first region and comprising at least first and second conductive meshes having different, respective geometrical characteristics.

14. The electronic apparatus according to claim 13, wherein the different, respective geometrical characteristics are selected from a group of properties consisting of a mesh pattern, a mesh pitch, a mesh trace width, and a mesh angle.

15. The electronic apparatus according to claim 8, wherein the conductive mesh is aperiodic.

16. The electronic apparatus according to claim 13, wherein the aperiodic conductive mesh has a pseudorandom pattern.

17. The electronic apparatus according to claim 8, wherein a mesh pattern of the conductive mesh has geometrical characteristics that are optimized to reduce electromagnetic emission from the area of the pad in a specified frequency band to within a predefined limit.

* * * * *